United States Patent
Mito et al.

(10) Patent No.: US 7,601,974 B2
(45) Date of Patent: Oct. 13, 2009

(54) CHARGED PARTICLE BEAM APPARATUS

(75) Inventors: Hiroaki Mito, Hitachinaka (JP); Katsuhiro Sasada, Hitachinaka (JP); Kazuo Kato, Naka (JP); Tomohiro Kudo, Hitachinaka (JP); Tomonori Saeki, Yokosuka (JP); Yasuo Yahagi, Tokyo (JP); Masayuki Kobayashi, Fujisawa (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/785,433

(22) Filed: Apr. 17, 2007

(65) Prior Publication Data

US 2007/0187601 A1    Aug. 16, 2007

Related U.S. Application Data

(63) Continuation of application No. 11/305,231, filed on Dec. 19, 2005, now Pat. No. 7,205,541.

(30) Foreign Application Priority Data

Nov. 22, 2005  (JP) .............................. 2005-336461

(51) Int. Cl.
  *A61N 5/00* (2006.01)
(52) U.S. Cl. .................................. 250/492.1; 250/492.2
(58) Field of Classification Search .... 250/492.1–492.3
  See application file for complete search history.

(56) References Cited

U.S. PATENT DOCUMENTS

| 3,790,155 | A |   | 2/1974 | Longamore |
|---|---|---|---|---|
| 3,813,544 | A | * | 5/1974 | Franzen et al. .............. 250/281 |
| 4,587,431 | A |   | 5/1986 | Uemura |
| 4,800,100 | A | * | 1/1989 | Herbots et al. .............. 427/527 |
| 5,244,820 | A | * | 9/1993 | Kamata et al. .............. 438/514 |
| 5,466,942 | A | * | 11/1995 | Sakai et al. .............. 250/492.2 |
| 5,493,125 | A |   | 2/1996 | Okayama et al. |
| 5,986,264 | A | * | 11/1999 | Grunewald .................. 250/310 |
| 6,188,075 | B1 | * | 2/2001 | Takayama et al. ........ 250/492.3 |
| 6,221,169 | B1 | * | 4/2001 | Bernstein et al. ............... 134/2 |
| 6,259,105 | B1 | * | 7/2001 | Eddy et al. ............. 250/492.21 |
| 6,394,109 | B1 | * | 5/2002 | Somekh ........................ 134/39 |
| 6,427,703 | B1 | * | 8/2002 | Somekh ...................... 134/1.1 |
| 6,504,163 | B2 | * | 1/2003 | Takayama et al. ........ 250/492.3 |
| 6,545,272 | B1 | * | 4/2003 | Kondo ........................ 250/305 |
| 6,545,274 | B1 | * | 4/2003 | Morita ........................ 250/307 |

(Continued)

FOREIGN PATENT DOCUMENTS

JP          5-135725         6/1993

(Continued)

*Primary Examiner*—David A Vanore
*Assistant Examiner*—Andrew Smyth
(74) *Attorney, Agent, or Firm*—Antonelli, Terry, Stout & Kraus, LLP.

(57) ABSTRACT

An object of this invention is to provide a charged particle beam apparatus that is capable of handling samples without adhering impurities onto the samples. In a scanning electron microscope in which a lubricant was coated on a sliding portion of a movable member that moves inside a vacuum chamber, a substance from which low molecular components were removed is used as the lubricant. It is thus possible to inhibit sample contamination and suppress the occurrence of defects in a process following measurement of the samples.

13 Claims, 7 Drawing Sheets

U.S. PATENT DOCUMENTS

| | | |
|---|---|---|
| 6,603,130 B1 | 8/2003 | Bisschops et al. |
| 6,744,054 B2 | 6/2004 | Mizuochi et al. |
| 6,762,422 B2 * | 7/2004 | Yamaguchi et al. ...... 250/491.1 |
| 6,855,929 B2 * | 2/2005 | Kimba et al. ............... 250/310 |
| 7,045,780 B2 * | 5/2006 | Kley ........................... 250/306 |
| 7,138,629 B2 * | 11/2006 | Noji et al. .................... 250/311 |
| 7,160,742 B2 * | 1/2007 | Steeples ....................... 438/17 |
| 7,235,795 B2 * | 6/2007 | Simmons ................. 250/492.2 |
| 7,378,670 B2 * | 5/2008 | Danciu et al. ........... 250/492.21 |
| 2002/0088940 A1 | 7/2002 | Watanabe et al. |
| 2002/0139939 A1 * | 10/2002 | Takayama et al. ........ 250/492.3 |
| 2002/0148975 A1 * | 10/2002 | Kimba et al. ............ 250/492.1 |
| 2003/0038252 A1 * | 2/2003 | Danciu et al. .......... 250/492.21 |
| 2004/0195525 A1 * | 10/2004 | Spill ....................... 250/492.1 |
| 2004/0256555 A1 * | 12/2004 | Shichi et al. ................. 250/307 |

FOREIGN PATENT DOCUMENTS

| | | |
|---|---|---|
| JP | 2004-259448 | 9/2004 |

* cited by examiner

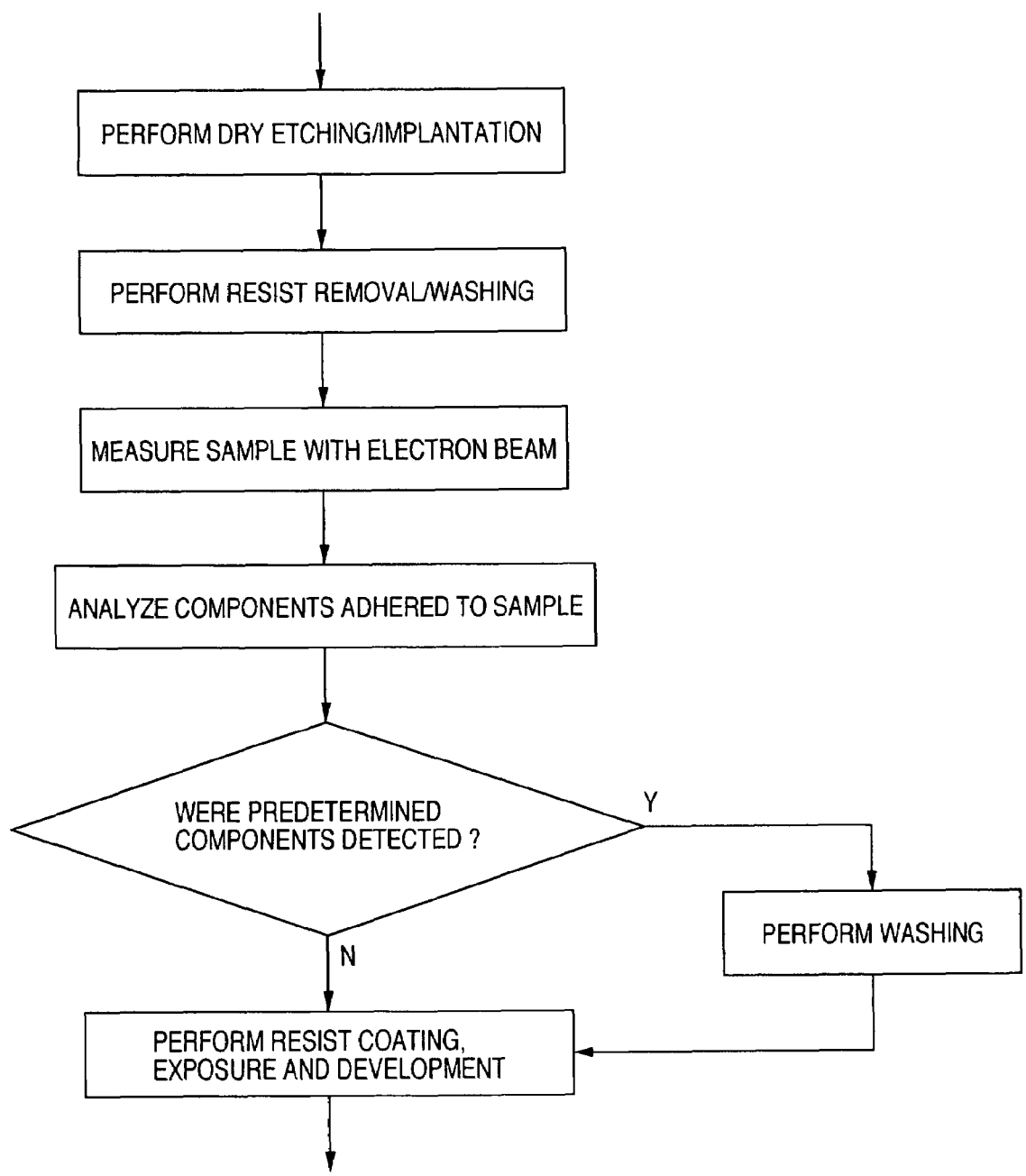

CHARGED PARTICLE BEAM APPARATUS

CROSS REFERENCE TO RELATED APPLICATION

This application is a Continuation of U.S. application Ser. No. 11/305,231, filed Dec. 19, 2005, now U.S. Pat. No. 7,205,541 which claims priority from Japanese patent application 2005-336461, filed Nov. 22, 2005, the contents of which are incorporated herein by reference.

BACKGROUND OF THE INVENTION

The present invention relates to a charged particle beam apparatus, and more particularly to a charged particle beam apparatus that is suitable for controlling the adherence to samples of low molecular components included in a lubricant used on a sliding part such as a sample stage.

In a process to produce a sample such as a semiconductor wafer, after coating a resist and performing exposure and development, process evaluation is performed by measuring a pattern width or the like using a CD-SEM (Critical Dimension-Scanning Electron Microscope) or the like. More specifically, in order to judge whether or not a pattern formed on a sample such as a semiconductor wafer was formed properly using a scanning electron microscope that is typically represented by a CD-SEM, the sample is transported by a sample stage to move the sample so that an electron beam is irradiated onto a desired pattern.

The sample stage is structured such that it can move in at least the direction perpendicular to the optical axis of the electron beam (X-Y direction), and is disposed inside an evacuated sample chamber. Technology that enhances lubricity by coating a fluorochemical oil as a lubricant on a sliding part such as a sample stage is disclosed in JP-A-2004-259448. Further, it is described in JP-A-5-135725 that, when not conducting observation of a sample, organic gas produced from grease used for a sample stage can be removed by heat treatment at 50 to 60° C.

SUMMARY OF THE INVENTION

It was recently revealed that there is a possibility of impurities adhering to a semiconductor wafer or the like that underwent a process of measurement or inspection with a scanning electron microscope. When such impurities adhere to the surface of the semiconductor wafer, for example, the impurities may cause the production of air bubbles in the resist in a resist coating process carried out thereafter. A problem may therefore occur whereby the resist is formed in a thin condition due to the air bubbles which in turn causes the generation of pits in the substrate in the dry etching treatment of a subsequent process.

Studies by the present inventors revealed that the impurities that adhere to samples are components included in lubricants used in electron microscopes, particularly fluorochemical compounds. These fluorochemical compounds are compounds that can be largely removed by undergoing a washing process. However, in order to reduce as much as possible the time and cost entailed in the semiconductor production process, it is preferable that the samples move directly to a resist coating process or the like after measurement or inspection with a scanning electron microscope without undergoing a washing process. Although, as disclosed in JP-A-5-135725, heating the sample chamber may be considered, in some cases substances which are weak with respect to heat, such as O-rings, are used inside the sample chamber, and it is thus not preferable to heat the sample chamber itself. There is also a possibility that evaporated grease may adhere to the walls inside the sample chamber and that grease may adhere to samples.

An object of the present invention is to provide a charged particle beam apparatus that is capable of handling samples without impurities adhering to the samples.

According to one principal aspect of this invention, in a scanning electron microscope in which a lubricant is coated on a sliding portion of a movable member that moves inside a vacuum chamber, a substance from which low molecular components have been removed is employed as the lubricant. As a result, it is possible to inhibit sample contamination and to suppress the occurrence of defects in the process after sample measurement.

Other objects, features and advantages of the invention will become apparent from the following description of the embodiments of the invention taken in conjunction with the accompanying drawings.

BRIEF DESCRIPTION OF THE DRAWINGS

FIG. 7 is a flowchart illustrating one part of a process for producing a semiconductor device.

DETAILED DESCRIPTION OF THE EMBODIMENTS

In a scanning electron microscope that performs measurement or inspection of samples such as semiconductor wafers, a sample stage that moves samples is provided in order to irradiate an electron beam onto a desired position. In the embodiments described below, examples are described in which the adherence of impurities to samples is inhibited while maintaining a high degree of lubricity for a sliding part of a movable member by coating an oil from which low molecular components were removed onto a sliding portion of a movable member represented by the sample stage.

In this connection, although a description is provided in the embodiments described hereunder for a scanning electron microscope that performs measurement and inspection for a semiconductor device by scanning an electron beam on the semiconductor device to detect electrons (secondary electrons and/or reflection electrons) that are discharged from the sample and then carrying out the measurement or inspection based on the discharged electrons, this invention is not limited thereto and can also be applied to other charged particle beam apparatuses.

Example 1

Figure 1:
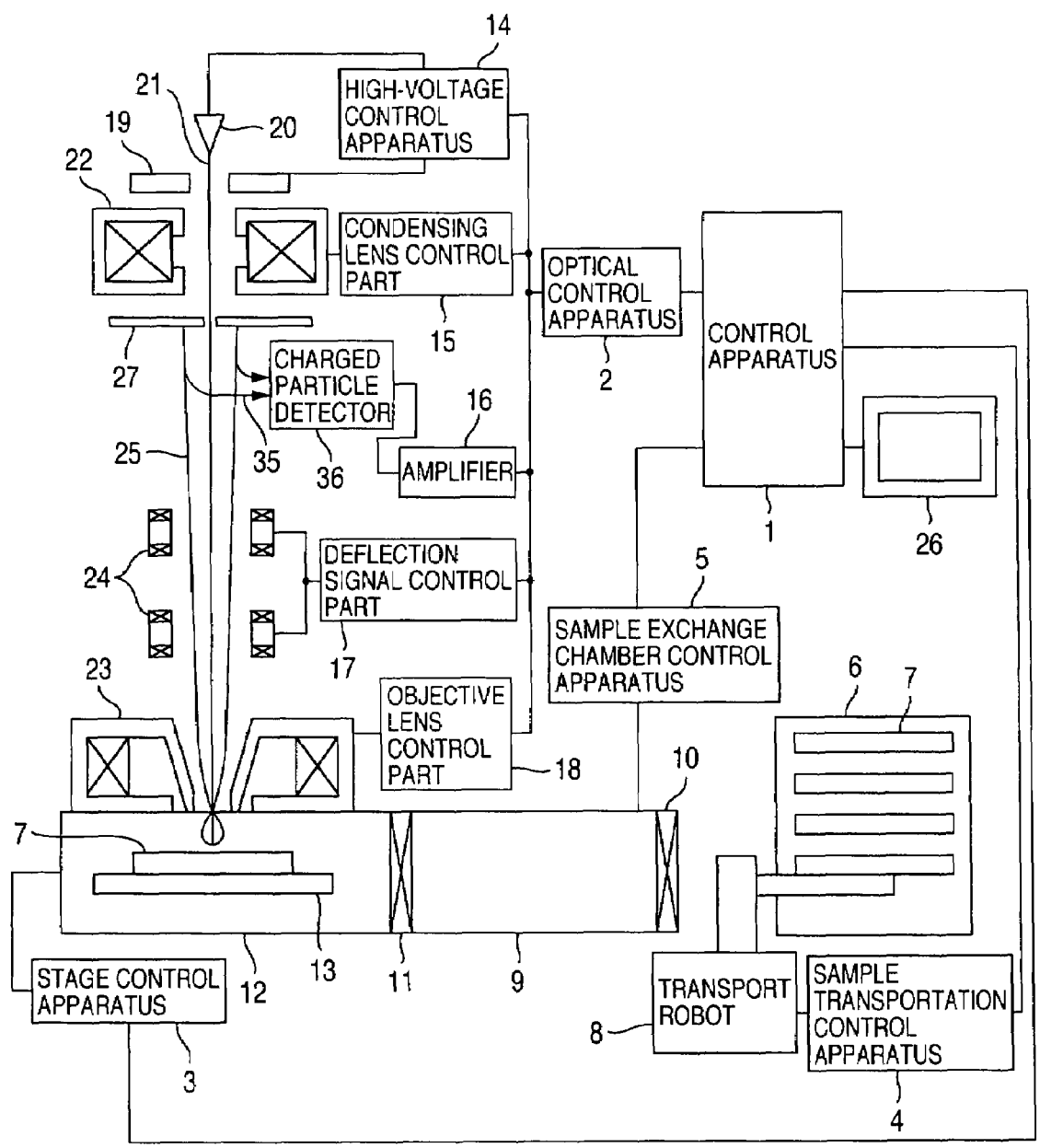
FIG. 1 is a view showing an outline of a scanning electron microscope.

FIG. 1 is a view for describing an outline of a scanning electron microscope that illustrates one example of this invention. A control apparatus 1 controls an optical control apparatus 2, a stage control apparatus 3, a sample transportation control apparatus 4 and a sample exchange chamber control apparatus 5 on the basis of an accelerating voltage, sample (semiconductor device) information, measurement location information, wafer cassette information and the like input by an operator from a user interface (not shown in the figure).

Upon receiving an instruction from the control apparatus 1, the sample transportation control apparatus 4 controls a transport robot 8 so as to transport an arbitrary wafer 7 from a wafer cassette 6 to a predetermined location in a load lock chamber 9 (sample exchange chamber). The sample exchange chamber control apparatus 5 carries out control so as to open and close gate valves 10 and 11 in response to movement of the wafer 7 into and out of the load lock chamber 9. Further, the sample exchange chamber control apparatus 5 controls a vacuum pump (not shown) that evacuates the inside of the load lock chamber 9, and when the gate valve 11 opens, produces a vacuum that is equal to that of a sample chamber 12 within the sample exchange chamber 9. The wafer 7 that was introduced into the sample exchange chamber 9 is transported to the sample chamber 12 through the gate valve 11 and is immobilized on a stage 13. The load lock chamber 9 and the sample chamber 12 are formed so as to surround a sample within a vacuum area.

In accordance with an instruction from the control apparatus 1, the optical control apparatus 2 controls a high-voltage control apparatus 14, a condensing lens control part 15, an amplifier 16, a deflection signal control part 17 and an objective lens control part 18.

An electron beam 21 that was derived from an electron source 20 by leading electrodes 19 is converged by a condensing lens 22 and an objective lens 23 and irradiated onto the wafer 7 disposed on the sample stage 13. The electron beam 21 is scanned one dimensionally or two dimensionally on the wafer 7 by deflectors 24 that received a signal from the deflection signal control part 17.

Secondary charged particles 25 that are discharged from the wafer 7 as a result of irradiating the electron beam 21 onto the wafer 7 are converted into secondary electrons 35 by secondary electron conversion electrodes 27. The secondary electrons 35 are then captured by a secondary charged particle detector 36 to be used as luminance signals for a display screen of a display apparatus 26 through the amplifier 16.

Further, by synchronizing a deflection signal of the display apparatus 26 and a deflection signal of the deflectors 24, a pattern that was formed on the wafer can be reproduced on the display apparatus 26.

Figure 2:
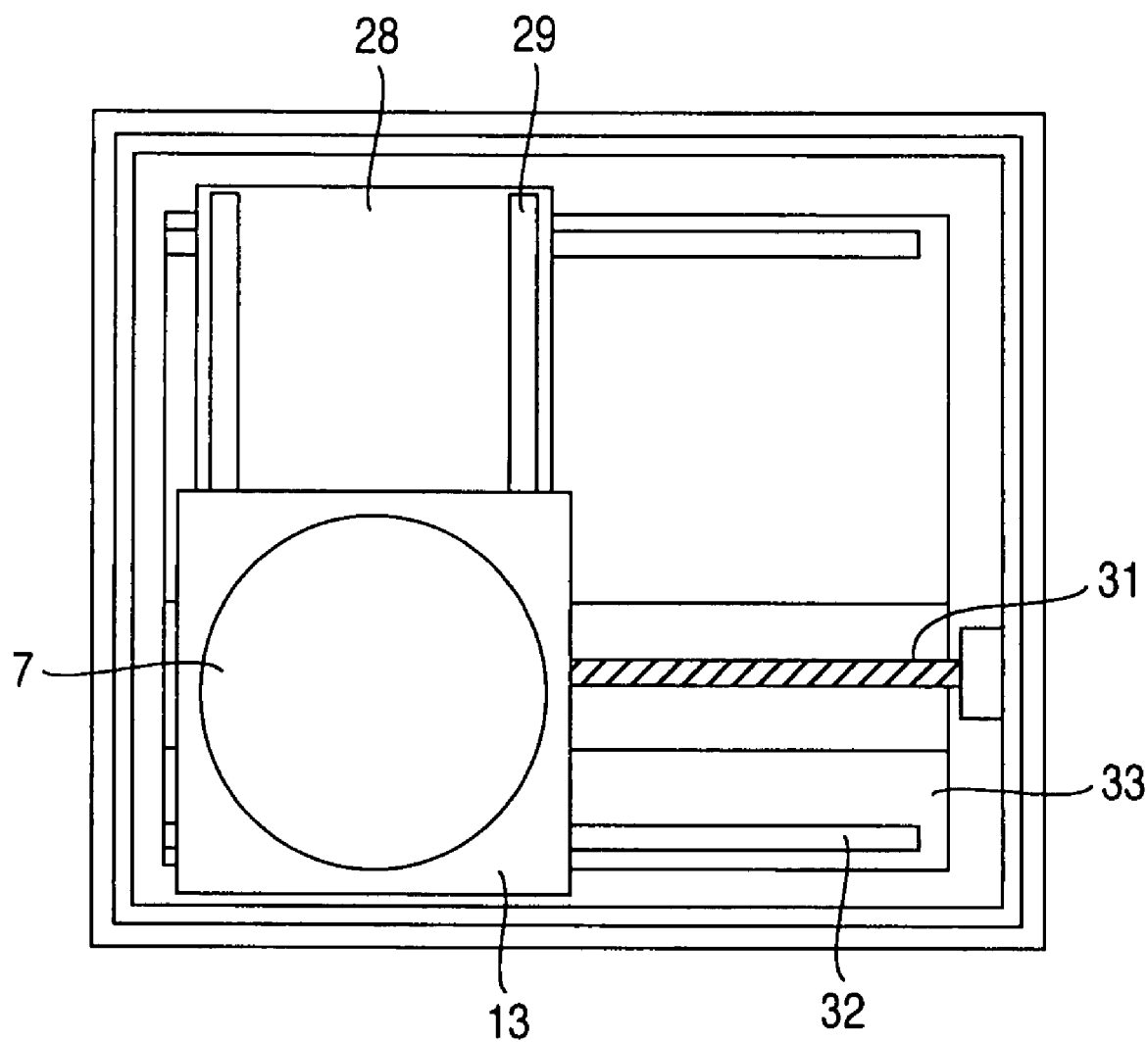
FIG. 2 is a view for describing an outline of a sample stage as one example of a sliding part.

FIG. 2 is a view for describing the details of the sample stage 13. The sample stage 13 is disposed on a Y base 28. The sample stage 13 moves in the Y direction on a Y rail 29 by means of a driving mechanism (not shown in the figure). The Y base 28 moves in the X direction on an X rail 32 that is formed on an X base 33 by the rotation of a ball screw 31 that is rotated by means of a driving mechanism (not shown). In order to conduct measurement or inspection at a plurality of points on a sample or to perform an overall inspection, the sample stage according to this example is designed such that an arbitrary location on the sample can be positioned under the orbit of an electron beam.

More specifically, a movement mechanism is provided that can move the sample stage 13 in a direction that is perpendicular (X-Y direction) to the optical axis of the electron beam (orbit of electron beam when electron beam is not deflected). In this connection, although a description is provided in this example for a stage that moves a sample stage in the X-Y directions, the invention is not limited thereto and, for example, it is also possible to apply a lubricant described below to a sliding part of a stage that inclines or rotates a sample stage.

In this example, a lubricant is coated on a sliding part (point of contact between two members when the two members slide to move relative to each other) of the sample stage mechanism in order to enhance the lubricity of that area. One example of the lubricant is a lubricant including a fluorine compound. In particular, since a lubricant including a fluorine compound that bonded with carbon is chemically stable and inactive, it is excellent as a lubricant for a stage or the like of a scanning electron microscope.

Although this type of lubricant including a fluorine compound has excellent properties for enhancing lubricity, a problem has been found in that low molecular components included therein adhere to the wafers. A lubricant (oil) that was purified in order to enhance lubricity possesses a predetermined molecular weight distribution. It is considered that when a part of the low molecular components therein fly out from the oil surface, because they are in a vacuum they disperse in various directions and collide into the walls inside the sample chamber and rebound back. It is also considered that low molecular components that adhered to the walls and the like inside the sample chamber are thus released therefrom and disperse again.

One part of the low molecular components that disperse inside the sample chamber is evacuated by evacuation inside the vacuum chamber. However, studies performed by the present inventors revealed that some of the low molecular components that disperse are repeatedly adhered and released before ultimately adhering to wafers in the sample chamber.

Studies of the present inventors also revealed that there is a possibility that the low molecular components that adhered to wafers, for example, cause air bubbles to be produced in a resist in a subsequent resist coating process. A problem may thus occur whereby the resist is formed in a thin condition due to the air bubbles, and this in turn causes the production of pits in a substrate in dry etching treatment in the subsequent process.

Recently, in order to reduce time and costs involved in the semiconductor production process, a process of washing the semiconductor wafers is being omitted in some conventional production processes. As a result, it is possible that the process moves to a resist coating step while low molecular components are still adhered to the semiconductor wafers, and this further increases the likelihood of defects occurring.

In this example, in order to reduce time and costs involved in the semiconductor production process while also eliminating the risk of defects occurring, the present inventors propose coating a sliding part of a movement mechanism of a sample stage or the like with a lubricant from which low moleculars that are thought to disperse in a vacuum are removed. Further, in this example, in order to purify an oil from which low moleculars were removed, the inventors propose performing heat purification at a temperature between 80 and 220° C. inside a vacuum chamber.

Figure 3:
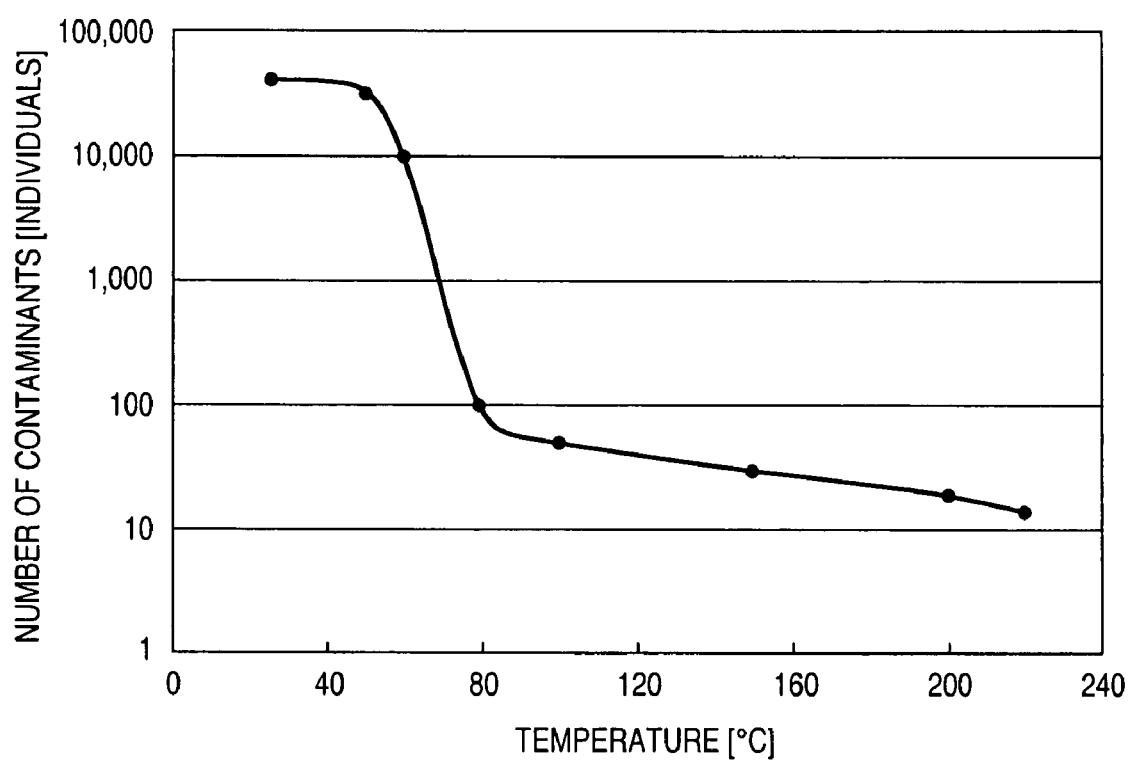
FIG. 3 is a view that shows the relationship between the temperature when performing heat purification of an oil and the number of contaminants adhering to the surface of a wafer.

FIG. 3 is a graph showing results obtained by simulating the relationship between the temperature when performing heat purification of an oil and the number of contaminants adhering to a wafer (for an entire wafer). The vertical axis shows the number of contaminants when a wafer was inspected using an optical contamination inspection apparatus and the horizontal axis shows the temperature when the oil underwent heat purification. The contaminants detected by the contamination inspection apparatus may be considered to be the above described low molecular components.

In this example, an oil (grease) including a fluorine compound was used as the oil to undergo heat purification. This oil is a compound that mainly includes perfluoropolyether (PFPE). Examples thereof include Fomblin® manufactured by SOLVAY SOLEXIS Inc., Demnam® manufactured by DAIKIN Industries, Ltd., Krytox® manufactured by Dupont Corporation and Barrierta® manufactured by NOK Kluver, Ltd. Although each of these lubricants is a compound that includes the three atoms carbon, fluorine and oxygen, studies by the present inventors confirmed that among these a part of fluorocarbon such as $CF_3$, $C_2F_5$ or $C_3F_7$ separates from oil in a vacuum and adheres to the wafer.

In this example, this kind of fluorine compound is removed by heat treatment before coating the oil on a sliding part of a sliding member disposed inside the vacuum chamber.

Further, in this example, as a heat purification method, a purification method is employed in which a thin layer of oil is disposed in a purification chamber, the purification chamber is evacuated, when the pressure reaches $10^{-4}$ Pa the chamber is heated to a predetermined temperature, 24 hours later the heating is stopped, and after the chamber cools the oil is taken out.

Referring to FIG. 3, it is shown that when the purification temperature is 60° C. or more the number of contaminants rapidly decreases, and when the purification temperature reaches 80° C. the acceptable number of 100 is arrived at for the number of contaminants. It was also found that when the purification temperature reaches approximately 80° C. or above, the decrease in the number of contaminants suddenly moderates and even if heat purification is conducted at a higher temperature it does not contribute very much to decreasing the number of contaminants. Further, when the temperature exceeds 220° C. a number of gases are generated from the oil. It is considered that the generation of gases indicates that the composition of the oil is changing, and there is thus a possibility that the lubricity will be reduced if the oil is heated at a temperature greater than that. Hence, in this example the heat purification temperature is set as less than 220° C.

By coating oil that was purified as described in the foregoing on a sliding part of a sample stage it is possible to inhibit the adherence of contaminants to a wafer.

In this connection, the requirements for a sample stage include that it is capable of high speed and high precision operation. In order to meet these requirements, the performance of the oil used as a lubricant is extremely important. In order to move the stage at high speed and stop it precisely, it is necessary for the kinetic viscosity of the oil to be within a predetermined range. Although the appropriate kinetic viscosity will differ according to the characteristics of the sample stage, in the case of the sample stage used in this example the kinetic viscosity is approximately 400 to 700 $mm^2/s$ at room temperature.

When the contaminants on a wafer were measured after the wafer was measured by a scanning electron microscope equipped with a sample stage having a sliding part that was coated with a common oil meeting this condition, 30,000 or more contaminants were confirmed. Thus, the method of this example which performs heat purification of an oil having a predetermined kinetic viscosity is an extremely effective method to eliminate low molecular components which are emitted from an oil while retaining a predetermined kinetic viscosity.

Figure 4:
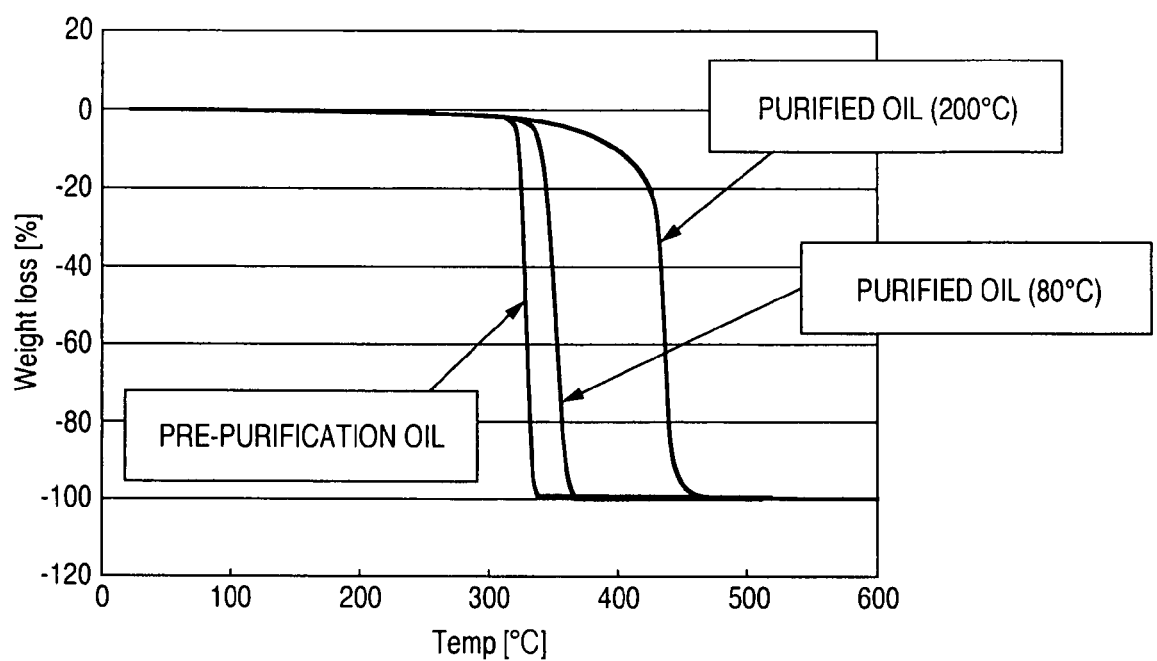
FIG. 4 is a view that illustrates the effect of an example as confirmed by thermal analysis.

Thermal analysis is available as a method for confirming whether low molecular components (components that disperse as the result of heating) of an oil were eliminated. This method is one in which oil of a certain quantity is heated and the weight loss is then plotted, and for an oil from which low molecular components were eliminated thereby, the heating temperature at which the weight decreases due to heating should be higher than for a normal oil. In this case, when the weight loss temperature of purified oil is plotted the result is as shown in FIG. 4. FIG. 4 shows that when purification is performed the weight loss temperature increases. More specifically, it is shown that low molecular components were adequately eliminated from an oil that underwent heat purification at 80° C. or above.

In this connection, regarding the heat purification conditions, when too many low molecular components are removed the oil viscosity increases. Conversely, when an insufficient quantity is removed a problem arises in that the low molecular components are not adequately eliminated. In this example it was confirmed that the above described effect could be obtained when components of an average molecular weight of 3,320 to 3,923 were removed from an oil of an average molecular weight of around 10,459 to 18,142. More specifically, it was confirmed that in comparison to an oil before purification, an oil from which components of an average molecular weight of 0.22 to 0.32 were eliminated adequately reduced the number of low molecular components adhering to a wafer while ensuring the necessary kinetic viscosity.

When substances present inside a sample chamber that was coated with an oil that was not heat purified were measured using a quadrupole mass spectrometer, substances of an atomic mass number of 69, 119, 169 and the like were detected. These correspond to the chemical formulae of $CF_3$, $C_2F_5$ and $C_3F_7$. In particular, $CF_3$ was detected the most. Using the above described heat purification it is possible to efficiently remove substances that may separate from an oil inside a vacuum chamber.

Although a case was described of coating the aforementioned oil onto a sliding part of a sample stage in the above description according to the present example, this invention is not limited thereto and, for example, a configuration may be adopted in which the aforementioned oil is coated on a guide rail or a crank arm inside a sample exchange chamber or a sliding part inside a vacuum chamber such as a sliding part of a gate valve.

Further, although in this example an oil including a fluorochemical compound was employed as a lubricant, this invention is not limited thereto and, for example, it is also possible to use an oil including a hydrocarbon compound.

FIG. 4 shows that while low molecular components that evaporate at less than 330° C. were present at approximately 40% before purification, they decreased to about 3% in oil that was purified at 80° C. Further, it is shown that they decreased to roughly less than 2% in oil that was purified at 200° C.

Although in the foregoing description a case was described of coating a heat-purified oil onto a sliding part, a method may also be adopted in which oil is first coated onto sliding parts and thereafter each sliding part is subjected to heat purification. In this case, since O-rings and the like that can be attached to a vacuum chamber are easily affected by heat, it is necessary to perform heat purification before attaching a synthetic resin such as an O-ring. The heat-purification conditions are roughly the same as the conditions described above.

Example 2

The embodiment described above relates to a specific technique that prevents impurities from adhering to a sample as well as the configuration of the apparatus. In contrast, hereunder a description is provided that relates to a method and apparatus that enable the performance of appropriate measures such as washing even in a case in which some kind of impurity adhered to a sample, by accurately recognizing that situation.

Figure 5:
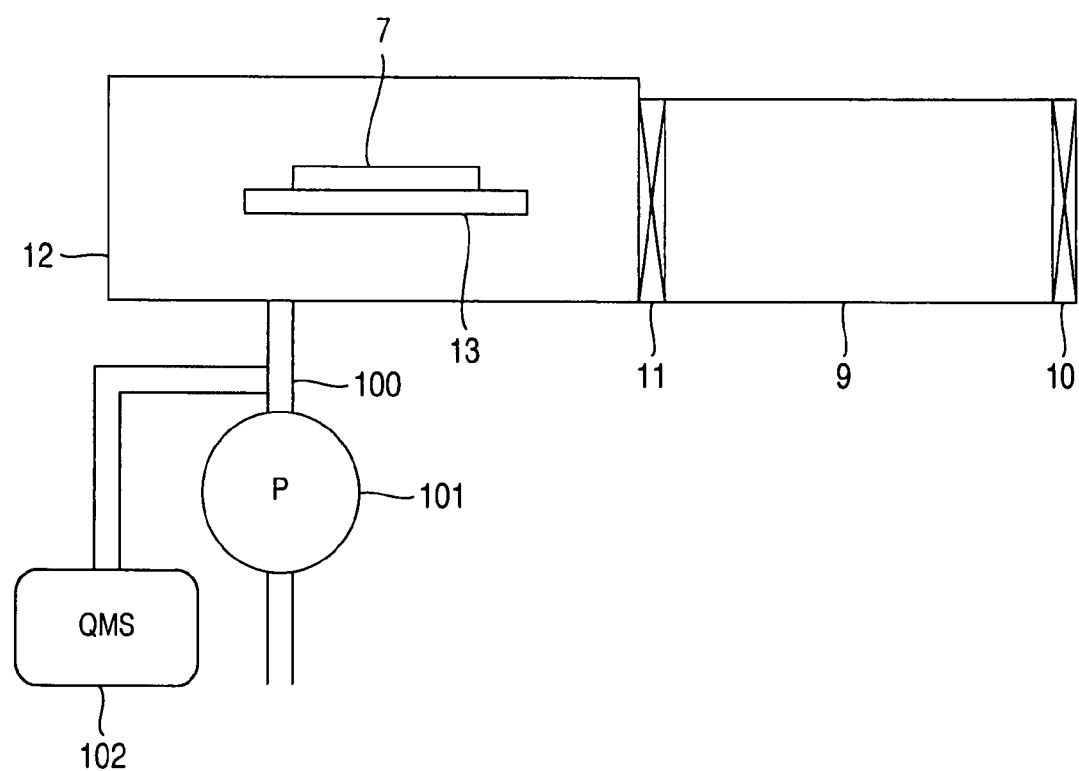
FIG. 5 is a view illustrating a case in which a quadrupole mass spectrometer that detects adherents to a sample was attached to a sample chamber of an electron microscope.

FIG. 5 is a view illustrating a case in which a detection apparatus for detecting substances that adhered to or that may adhere to a sample was provided in a sample chamber of an electron microscope. FIG. 5 is an enlarged view of the load lock chamber 9 and the sample chamber 12 of FIG. 1. In the sample chamber 12 is provided a vacuum pump 101 for evacuating the inside of the sample chamber 12 through an evacuation pipe 102.

To the evacuation pipe 100 is connected a quadrupole mass spectrometer 102 for analyzing components of trace amounts of gases passing through the inside of the evacuation pipe 102, to thereby enable analysis of trace amounts of gases in the vacuum. The apparatus is configured such that an analysis result of the quadrupole mass spectrometer 102 is stored in a storage medium inside the control apparatus 1 and displayed on the display apparatus 26.

The substances that may cause a problem in the semiconductor wafer production process performed following measurement by the electron microscope include, for example, phthalate substances, substances including aliphatic hydrocarbons and substances including perfluoropolyether. Further, in mass spectrometry, in some cases one substance that was broken into fragments of a plurality of atomic mass numbers is detected. In this example, although atomic mass number 69 derived from CF3+, atomic mass number 135 derived from C2F5O+ and the like can be considered as the atomic mass numbers that are displayed, the invention is not limited thereto.

When the aforementioned kinds of substances and/or atomic mass numbers are detected, by displaying a screen to that effect on the display apparatus 26 a decision can be made regarding whether to perform washing of the semiconductor wafer after measurement by the electron microscope or to transport the semiconductor wafer directly to the next step in the semiconductor production process. In particular, a configuration may be adopted such that an error message is displayed when a predetermined substance, substance amount or atomic mass number was detected, to indicate the possibility that a defect may occur if the semiconductor wafer is transported directly to the next step.

It is also possible to grasp the condition of the apparatus by monitoring the changes over time in the detection results, storing the results and displaying them in a graph form on the display apparatus 26.

In addition, although in this case analysis results are displayed on the display apparatus 26 of a control computer, the invention is not necessarily limited thereto and another kind of display device, such as an LED, may also be used.

Although a case was described for this example in which the quadrupole mass spectrometer 102 was connected to the evacuation pipe 102 as a location in which it is easy to detect gas, the invention is not limited thereto, and the quadrupole mass spectrometer may be connected to any location as long as it is one in which low molecular components or the like that adhere to a wafer can be adequately detected.

A user of the apparatus can analyze the level of cleanliness of the apparatus using the quadrupole mass spectrometer 102 and learn the result through the display apparatus 26 or the like. For example, this allows the user to make a decision such as to clean the apparatus when there is a large amount of C2F5O+.

Example 3

Figure 6:
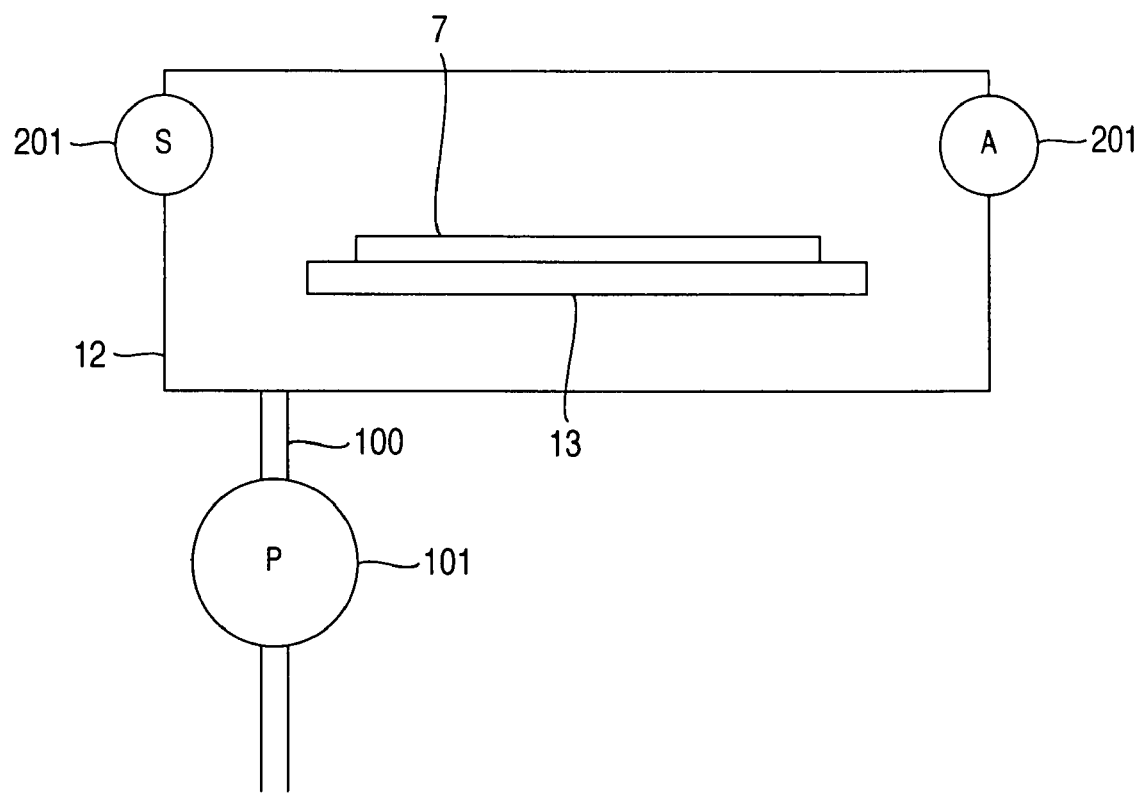
FIG. 6 is a view illustrating a case in which an optical analyzer that detects adherents to a sample was attached to a sample chamber of an electron microscope.

In this embodiment, another example of installing in a sample chamber of an electron microscope a detection apparatus for detecting substances that adhered to or that may adhere to a sample is described using FIG. 6.

FIG. 6 illustrates an example in which a light source 201 and a detector 202 of an infrared spectrophotometer were installed in a sample chamber 12 of an electron microscope. The light source 201 and the detector 202 are disposed in a condition such that there is no obstruction in the space between them, and such that it is possible to detect the state in the area between the light source 201 and the detector 202 when gas is generated inside the sample chamber 12. A configuration is adopted whereby an analysis result of the infrared spectrophotometer is stored on a storage medium within the control apparatus 1 and displayed on the display apparatus 26.

The configuration is such that several kinds of substances that may have an effect on a semiconductor wafer among the analysis results are displayed on the display apparatus 26. Similarly to Example 1, information relating to substances that may cause a problem in the semiconductor wafer production process is displayed on the display apparatus 26.

In this connection, although in this case an example is described which uses an infrared spectrophotometer as an analyzer, the analyzer may be another type of optical analyzer such as, for example, an ellipsometer, and in that case also a light source may be disposed at the position denoted by reference numeral 201 and a detector may be disposed at the position denoted by reference numeral 202. Although in ellipsometry a phase difference delta and an angle of deflection psi are first obtained and appropriate numerical values can therefore be selected and displayed on a display apparatus thereafter, the method is not limited thereto, and values obtained by an operation based thereon such as, for example, a refractive index or film thickness of a film on the surface may be displayed.

It is also possible to employ a quartz resonator microbalance as a detector in place of an optical analyzer. A quartz resonator microbalance is a device that analyses substances that adhered to a quartz resonator on the basis of resonance frequency variations, and when low molecular components are produced inside a sample chamber the quartz resonator microbalance can detect that situation.

Example 4

FIG. 7 is a flowchart showing one part of a process for producing a semiconductor device. In this embodiment, following a dry etching/ion implantation step, measurement of a sample is performed using an electron beam after the sample undergoes a resist removal/washing step. At this time, the level of contamination of the semiconductor device is measured inside a scanning electron microscope using an analyzer as described in Example 2 or 3. If the presence of contaminating substances is detected or if the detected level of contaminating substances is equal to or greater than a certain threshold value, the sample undergoes a washing step before being transported to the next production step.

The semiconductor production process is managed such that if contaminating substances are not detected or if the detected level of contaminating substances is less than a certain threshold value, the sample is transported directly to the next step without undergoing a washing step.

By handling semiconductor devices in the manner described in the foregoing, it is possible to achieve compatibility between enhancing the efficiency of the semiconductor production process and suppressing the occurrence of defects due to contaminating substances. Further, in a case where there is a scanning electron microscope that uses the lubricant described in Example 1 and a scanning electron microscope that does not use the lubricant among a plurality of scanning electron microscopes, a configuration may be adopted whereby a sample which was measured by the scanning electron microscope that uses the lubricant described in Example 1 moves directly to the next production step while a sample measured by the scanning electron microscope that does not use the lubricant described in Example 1 undergoes a washing step before moving to the next production step. Further, a configuration may be adopted whereby that decision is made in accordance with the relationship between the kinds of contaminating substances and the subsequent production step.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A charged particle beam apparatus comprising:
a charged particle beam for irradiating a sample;
a detector for detecting charged particles released from the sample;
a vacuum chamber that surrounds the sample; and
a detection apparatus which detects one or more substances selected from the group consisting of aliphatic hydrocarbon-based substances, phthalate substances, perfluoropolyether-based substances inside the vacuum chamber, and a component included in a lubricant used inside the vacuum chamber;
wherein the detection apparatus includes a spectrophotometer.

2. The charged particle beam apparatus according to claim 1, further comprising a display apparatus which displays a detection result of the detection apparatus.

3. The charged particle beam apparatus according to claim 1, wherein the detection apparatus detects a molecular weight of the detected substances.

4. The charged particle beam apparatus according to claim 1, wherein the detection apparatus includes a storage media which stores changes over time to a molecular weight of the detected substances.

5. The charged particle beam apparatus according to claim 1, wherein the spectrophotometer is a quadrupole mass spectrophotometer.

6. The charged particle beam apparatus according to claim 1, wherein the spectrophotometer is an infrared spectrophotometer.

7. The charged particle beam apparatus according to claim 1, wherein the spectrophotometer is an ellipsometer.

8. The charged particle beam apparatus according to claim 1, wherein the detection apparatus uses a quartz resonator microbalance as a detector.

9. A sample measurement method performing a sample measurement by a charged particle beam during a semiconductor production process, comprising:
detecting one or more substances released from a sample inside a vacuum chamber of an apparatus performing the sample measurement, wherein the substances are selected from the group consisting of aliphatic hydrocarbon-based substances, phthalate substances, perfluoropolyether-based substances, and a component included in a lubricant used inside the vacuum chamber;
moving sample to a next semiconductor production process after a washing process, when the substances are detected at or above a predetermined value; and
moving the sample to a next semiconductor production process without washing, when the substances are not detected.

10. The method according to claim 9, wherein when the substances are not detected or detected below a predetermined value, the sample is moved to a next semiconductor production process without a washing process.

11. The method according to claim 9, wherein the next semiconductor production process a resist coating process.

12. A sample measurement method performing a sample measurement by a charged particle beam during a semiconductor production process, comprising:
moving the sample to a next semiconductor production process without the washing process of the sample, when a measurement by a charged particle beam apparatus which uses a lubricant from which low molecular components are removed is performed, and
moving the sample to a next semiconductor production process after the washing process of the sample, when a measurement by a charged particle beam apparatus which uses a lubricant from which low molecular components are not removed is performed.

13. The method according to claim 12, wherein the next semiconductor production process is a resist coating process.

* * * * *